US012787876B2

(12) United States Patent
Han et al.

(10) Patent No.: US 12,787,876 B2
(45) Date of Patent: Nov. 3, 2026

(54) DISPLAY MODULE INCLUDING BONDING MEMBER CONNECTING BETWEEN LIGHT EMITTING DIODE AND SUBSTRATE

(71) Applicant: SAMSUNG ELECTRONICS CO., LTD., Suwon-si (KR)

(72) Inventors: Seungryong Han, Suwon-si (KR); Yeonghyeon Seo, Suwon-si (KR); Sangmoo Park, Suwon-si (KR); Jinyoung Kim, Suwon-si (KR); Byunghoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 396 days.

(21) Appl. No.: 18/373,048

(22) Filed: Sep. 26, 2023

(65) Prior Publication Data

US 2024/0079365 A1 Mar. 7, 2024

Related U.S. Application Data

(63) Continuation of application No. PCT/KR2023/012635, filed on Aug. 25, 2023.

(30) Foreign Application Priority Data

Sep. 1, 2022 (KR) ........................ 10-2022-0110782

(51) Int. Cl.

*H10W 90/00* (2026.01)
*H10W 72/00* (2026.01)
*H10W 72/30* (2026.01)

(52) U.S. Cl.

CPC ...... *H10W 90/00* (2026.01); *H10W 72/01304* (2026.01); *H10W 72/07332* (2026.01);
(Continued)

(58) Field of Classification Search

None
See application file for complete search history.

(56) References Cited

U.S. PATENT DOCUMENTS 10,064,274 B2 8/2018 Kim et al.
10,272,598 B2 4/2019 Shinohara et al.
(Continued)

FOREIGN PATENT DOCUMENTS

EP 3 961 299 A1 3/2022
JP 2002-75580 A 3/2002
(Continued)

OTHER PUBLICATIONS

Communication issued on Sep. 11, 2025 by the European Patent Office in European Patent Application No. 23860794.9.
(Continued)

*Primary Examiner* — Anthony Ho
(74) *Attorney, Agent, or Firm* — Sughrue Mion, PLLC

(57) ABSTRACT

A display module is provided. The display module includes: a substrate partitioned into a plurality of pixel regions and including a plurality of electrode pads disposed in the pixel regions; a bonding member including an adhesive layer stacked on one surface of the substrate and a plurality of conductive balls disposed in the adhesive layer; and a plurality of light emitting diodes including electrodes connected to the plurality of electrode pads by the plurality of conductive balls, in which the plurality of conductive balls are patterned as a conductive region corresponding to the plurality of electrode pads.

10 Claims, 20 Drawing Sheets

(52) U.S. Cl.
CPC ........ *H10W 72/344* (2026.01); *H10W 72/348* (2026.01); *H10W 72/352* (2026.01); *H10W 72/354* (2026.01); *H10W 90/732* (2026.01)

(56) References Cited

U.S. PATENT DOCUMENTS

| | | | |
|---|---|---|---|
| 10,494,549 | B2 | 12/2019 | Kim et al. |
| 10,575,410 | B2 | 2/2020 | Haga et al. |
| 11,362,249 | B2 | 6/2022 | Chung et al. |
| 11,404,403 | B2 | 8/2022 | Chung et al. |
| 11,417,866 | B2 | 8/2022 | Kim et al. |
| 11,424,224 | B2 | 8/2022 | Jang et al. |
| 11,842,987 | B2 | 12/2023 | Jang et al. |
| 2017/0013722 | A1 | 1/2017 | Kim et al. |
| 2018/0151849 | A1 | 5/2018 | Kim et al. |
| 2019/0348588 | A1 | 11/2019 | Hsieh |
| 2020/0343227 | A1 | 10/2020 | Jang et al. |
| 2021/0111324 | A1 | 4/2021 | Chung et al. |
| 2021/0114147 | A1 | 4/2021 | Akai et al. |
| 2022/0367427 | A1 | 11/2022 | Jang et al. |
| 2022/0375908 | A1 | 11/2022 | Lee et al. |
| 2023/0389376 | A1 | 11/2023 | Jang |

FOREIGN PATENT DOCUMENTS

| | | | |
|---|---|---|---|
| JP | 2003-286457 | A | 10/2003 |
| JP | 4130747 | B2 | 8/2008 |
| KR | 10-2017-0005950 | A | 1/2017 |
| KR | 10-2017-0053212 | A | 5/2017 |
| KR | 10-2017-0057363 | A | 5/2017 |
| KR | 10-2018-0061877 | A | 6/2018 |
| KR | 10-2020-0071497 | A | 6/2020 |
| KR | 10-2020-0129898 | A | 11/2020 |
| KR | 10-2021-0004324 | A | 1/2021 |
| KR | 10-2021-0021544 | A | 2/2021 |
| KR | 10-2021-0043236 | A | 4/2021 |
| KR | 10-2258524 | B1 | 5/2021 |
| KR | 10-2021-0064433 | A | 6/2021 |
| KR | 10-2021-0108124 | A | 9/2021 |
| KR | 10-2021-0141954 | A | 11/2021 |
| KR | 10-2021-0145724 | A | 12/2021 |
| KR | 10-2421771 | B1 | 7/2022 |
| KR | 10-2022-0111806 | A | 8/2022 |
| KR | 10-2022-0114967 | A | 8/2022 |
| KR | 10-2023-0165966 | A | 12/2023 |

OTHER PUBLICATIONS

International Search Report (PCT/ISA/210) issued on Dec. 12, 2023 by the International Searching Authority for International Patent Application No. PCT/KR2023/012635.

Written Opinion (PCT/ISA/237) issued on Dec. 12, 2023 by the International Searching Authority for International Patent Application No. PCT/KR2023/012635.

Communication issued on Jul. 16, 2026 by the Korean Ministry of Intellectual Property (MOIP) in Korean Patent Application No. 10-2022-0110782.

DISPLAY MODULE INCLUDING BONDING MEMBER CONNECTING BETWEEN LIGHT EMITTING DIODE AND SUBSTRATE

CROSS REFERENCE TO RELATED APPLICATIONS

The present application is a continuation of international application PCT/KR2023/012635 filed on Aug. 25, 2023 in the Korean Intellectual Property Office (KIPO), which claims benefit of priority to KR Patent Application No. 10-2022-0110782 filed on Sep. 1, 2022 in KIPO. The contents of the above applications are hereby incorporated by reference.

BACKGROUND

Field

Apparatuses and methods consistent with the disclosure relate to a display module including a bonding member electrically and physically connecting between a light emitting diode and a substrate.

Description of the Related Art

A display panel includes a substrate on which a plurality of thin film transistors (TFTs) are provided, and a plurality of light emitting diodes mounted on the substrate. The plurality of light emitting diodes may be inorganic light emitting diodes that emit light by themselves. The plurality of light emitting diodes express various colors while being operated in units of pixels or sub-pixels. The operation of each pixel or sub-pixel is controlled by the plurality of TFTs. The respective light emitting diodes emit various colors, for example red, green and blue.

SUMMARY

When using an inorganic light emitting diode having a size of 100 μm or less, the inorganic light emitting diodes may be placed with a density such that the electrical connecting pads and corresponding conductive balls are close, one to another. This occurs for diodes placed with a fine pitch (500 μm or less) or ultra-fine pitch (pitch less than fine pitch). A problem solved herein is that during manufacturing of a display module the conductive balls may not provide good contact and/or may collect together. Embodiments provide an anisotropic conductive film with good contact and without the conductive balls grouped together, thus solving the problem. Some embodiments include using grooves in a mold substrate, thereby controlling alignment of the conductive balls.

A display module according to one example of the disclosure includes: a substrate partitioned into a plurality of pixel regions and including a plurality of electrode pads disposed in the pixel regions; a bonding member including an adhesive layer stacked on one surface of the substrate and a plurality of conductive balls disposed in the adhesive layer; and a plurality of light emitting diodes including electrodes connected to the plurality of electrode pads by the plurality of conductive balls, in which the plurality of conductive balls are patterned as conductive regions corresponding to the plurality of electrode pads.

A pattern of the plurality of conductive balls may be a stripe pattern in which the conductive regions are disposed in the pixel regions adjacent to each other and connect, in a straight line, the plurality of electrode pads.

A pattern of the plurality of conductive balls may be an island pattern in which the conductive regions are independently disposed in the plurality of pixel regions, respectively.

A pixel provided in the plurality of pixel regions may include a plurality of sub-pixels. The conductive region disposed in each of the plurality of pixel regions may include a plurality of sub-conductive regions corresponding to the plurality of sub-pixels. The plurality of sub-conductive regions may be spaced apart from each other.

At least two of the plurality of conductive balls may be aligned in a thickness direction of the adhesive layer.

A bonding member according to one example of the disclosure connects between electrodes of a light emitting diode and electrode pads of a display substrate. The bonding member includes: an adhesive layer; and a plurality of conductive balls disposed in the adhesive layer. The plurality of conductive balls are patterned as conductive regions in a part of an entire region of the bonding member.

The bonding member may further include an additional adhesive layer stacked on the adhesive layer.

The adhesive layer may have a black-based color.

A manufacturing method for a bonding member according to one example of the disclosure includes: forming a mold substrate having one surface in which a plurality of grooves are patterned; aligning a plurality of conductive balls in the plurality of grooves; disposing the mold substrate to correspond to an adhesive layer in such a way that the plurality of conductive balls face the adhesive layer; and disposing the plurality of conductive balls in the adhesive layer by pressing the mold substrate against the adhesive layer.

The plurality of grooves may have a depth (D) that is at least twice the diameter of the plurality of conductive balls in a thickness direction of the mold substrate.

Surface treatment for preventing attachment of the conductive balls may be performed on a region in which the plurality of grooves are not formed in the one surface of the mold substrate. The surface treatment may be plasma treatment for forming fine irregularities or may be hydrophobic treatment.

An adhesive may be applied on the plurality of grooves before aligning the plurality of conductive balls in the plurality of grooves. Accordingly, the plurality of conductive balls may be easily aligned in the plurality of grooves.

A plurality of holes communicating with the plurality of grooves may be formed in the other surface of the mold substrate. In the aligning of the plurality of conductive balls in the plurality of grooves, a negative pressure may be formed in the plurality of grooves through the plurality of holes to insert the plurality of conductive balls into the plurality of grooves.

In some embodiments of the manufacturing method, the plurality of conductive balls in the plurality of grooves are configured to support electrical connection of inorganic light emitting diodes disposed at an ultra-fine pitch on a substrate of a display module.

In some embodiments of the manufacturing method, the plurality of grooves are in a mold substrate, and the plurality of grooves are treated with a plasma to prevent the plurality of conductive balls from sticking to the mold substrate.

In some embodiments of the manufacturing method, the display module comprises a display driver integrated circuit (IC) for controlling the substrate, and the process includes mounting the inorganic light emitting diodes on the substrate of the display module.

In some embodiments of the manufacturing method, the inorganic light emitting diodes are in a form of micro LED chips, the substrate of the display module is an anisotropic conductive film (ACF), and the process includes mounting the micro LED chips to the ACF using a thermo-compression bonding process.

DETAILED DESCRIPTION

Figure 1:
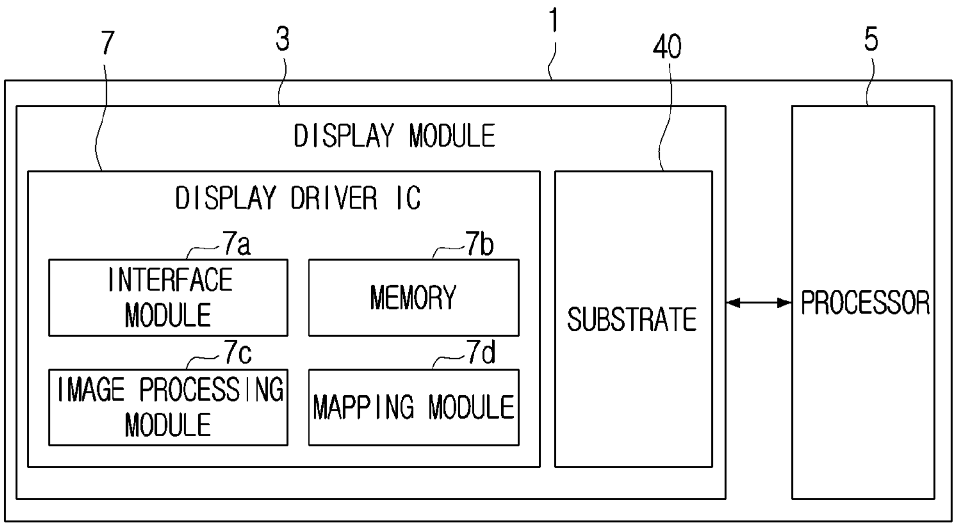
FIG. 1 is a block diagram illustrating a display apparatus according to one example of the disclosure.

Hereinafter, various embodiments will be described in more detail with reference to the accompanying drawings. Embodiments mentioned in the specification may be variously modified. A specific embodiment may be illustrated in the drawings and be described in detail in a detailed description. However, the specific embodiment illustrated in the accompanying drawings is provided only to allow various embodiments to be easily understood. Therefore, it should be understood that the spirit of the disclosure is not limited by the specific embodiment illustrated in the accompanying drawings, and includes all the equivalents and substitutions included in the spirit and the scope of the disclosure.

In the disclosure, terms including ordinal numbers such as "first", "second", and the like, may be used to describe various components. However, these components are not limited by these terms. These terms are used only to distinguish one component from another component.

It should be further understood that terms "include" or "have" used in the disclosure specify the presence of features, numerals, steps, operations, components, parts mentioned in the specification, or combinations thereof, but do not preclude the presence or addition of one or more other features, numerals, steps, operations, components, parts, or combinations thereof. It is to be understood that in case that one component is referred to as being "connected to" or "coupled to" another component, one component may be connected directly to or coupled directly to another component or be connected to or coupled to another component with the other component interposed therebetween. On the other hand, it is to be understood that in case that one component is referred to as being "connected directly to" or "coupled directly to" another component, it may be connected to or coupled to another component without the other component interposed therebetween.

In the disclosure, the expression "the same" not only includes complete sameness but also a difference in consideration of a matching error range.

Further, in describing the disclosure, in case that it is determined that a detailed description for known functions or configurations related to the disclosure may unnecessarily obscure the gist of the disclosure, the detailed description therefor will be abbreviated or omitted.

According to one example, a display module may include a substrate and a plurality of image display light emitting diodes arranged on the substrate.

According to one example, the light emitting diode included in the display module may be an inorganic light emitting diode having a size of 100 μm or less. For example, the inorganic light emitting diode may be a micro light emitting diode (LED) or a mini LED, but is not limited thereto. The inorganic light emitting diodes have a higher brightness, a higher luminous efficiency, and a longer lifetime than an organic light emitting diode (hereinafter, referred to as an "OLED"). The inorganic light emitting diode may be a semiconductor chip capable of emitting light by oneself based on power supplied thereto. The inorganic light emitting diode has a fast reaction speed, low power consumption, and a high luminance. In case that the inorganic light emitting diode is the micro LED, efficiency in converting electricity into photons may be higher than that of a liquid crystal display (LCD) or the OLED. For example, the micro LED may have a higher "brightness per watt" than the LCD or the OLED display. Accordingly, the micro LED can produce the same brightness with about half the energy as compared to the LED or OLED whose size exceeds 100 μm. The micro LED may implement a high resolution and an excellent color, contrast, and brightness, and may thus accurately express a wide range of colors and implement a clear screen even in the outdoors brighter than indoors. Because the micro LED is resistant to a burn-in phenomenon and generates a small amount of heat, a long lifespan of the micro LED is ensured without deformation of the micro LED.

According to one example, the light emitting diode may be formed in the form of a flip chip in which an anode electrode and a cathode electrode are disposed on a surface opposite to a light emitting surface.

According to one example, a thin film transistor (TFT) layer in which a TFT circuit is formed may be disposed on a first surface (for example, a front surface of the substrate) of the substrate. A power supply circuit that supplies power to the TFT circuit, a data driver, a gate driver, and a timing controller that controls each driver may be disposed on a second surface (for example, a rear surface of the substrate) of the substrate. The substrate may have a plurality of pixels arranged on the TFT layer. Each pixel may be driven by the TFT circuit.

According to one example, the TFT formed in the TFT layer may be a low-temperature polycrystalline silicon (LTPS) TFT, a low-temperature polycrystalline oxide (LTPO) TFT, or an oxide TFT.

According to one example, the substrate on which the TFT layer is provided may be a glass substrate, a flexible synthetic resin-based substrate (for example, polyimide (PI), polyethylene terephthalate (PET), polyethersulfone (PES), polyethylene naphthalate (PEN), or polycarbonate (PC)), or a ceramic substrate.

According to one example, the TFT layer of the substrate may be formed integrally with the first surface of the substrate, or may be manufactured in the form of a separate film and attached to the first surface of the substrate.

According to one example, the first surface of the substrate may be divided into an active region and an inactive region. The active region may be a region occupied by the TFT layer in the entire region of the first surface of the substrate. The inactive region may be a region excluding the active region from the entire region of the first surface of the substrate.

According to one example, an edge region of the substrate may be the outermost region of the substrate. For example, the edge region of the substrate may include a region corresponding to a side surface of the substrate, a partial region of the first surface of the substrate that is adjacent to the side surface, and a partial region of the second surface of the substrate. A plurality of side wires electrically connecting the TFT circuit on the first surface of the substrate and the drive circuits on the second surface of the substrate may be disposed in the edge region of the substrate.

According to one example, the substrate may be a quadrangle type substrate. For example, the substrate may be a rectangle type or square type substrate.

According to one example, the TFT provided on the substrate may also be implemented by, for example, an oxide TFT, a Si TFT (a poly silicon or a-silicon), an organic TFT, or a graphene TFT, in addition to the low-temperature polycrystalline silicon TFT (LTPS TFT). The TFT may be applied by producing only a P-type (or N-type) metal-oxide-semiconductor field-effect transistor (MOSFET) in a Si wafer complementary metal-oxide-semiconductor (CMOS) process.

According to one example, the TFT layer in which the TFT circuit is formed may be omitted in the substrate. In this case, a plurality of micro integrated circuit (IC) chips functioning as the TFT circuit may be mounted on the first surface of the substrate. In this case, the plurality of micro IC chips may be electrically connected to the plurality of light emitting diodes arranged on the first surface of the substrate through the wires.

According to one example, a pixel driving method for the display module may be an active matrix (AM) driving method or a passive matrix (PM) driving method.

According to one example, the display module may be installed in and applied to a wearable device, a portable device, a handheld device, and electronic products or electric parts that require various displays.

According to one example, a display apparatus such as a personal computer monitor, a high-resolution television, a signage (or a digital signage), and an electronic display is provided by connecting a plurality of display modules in a grid form.

According to one example, one pixel may include a plurality of light emitting diodes. In this case, one light emitting diode may be a sub-pixel. In the disclosure, one "light emitting diode", one "micro LED", and one "sub-pixel" may be used interchangeably as the same meaning.

Hereinafter, one example will be described in detail with reference to the accompanying drawings so that those skilled in the art to which the disclosure pertains may easily practice the disclosure. However, the example may be modified in various different forms, and is not limited to the example described herein. In the drawings, portions unrelated to the description will be omitted to obviously describe the example of the disclosure, and similar reference numerals will be used to describe similar portions throughout the specification.

Hereinafter, a display apparatus according to one example of the disclosure will be described with reference to the drawings.

FIG. 1 is a block diagram illustrating the display apparatus according to one example of the disclosure.

Referring to FIG. 1, a display apparatus 1 according to one example of the disclosure may include a display module 3 and a processor 5.

The display module 3 may display various images. Here, the image is a concept including a still image and/or a moving image. The display module 3 may display various images such as a broadcast content and a multimedia content. In addition, the display module 3 may display a user interface and an icon.

The display module 3 may include a substrate 40 and a display driver integrated circuit (IC) 7 for controlling the substrate 40.

The display driver IC 7 may include an interface module 7a, a memory 7b (for example, a buffer memory), an image processing module 7c, or a mapping module 7d. The display driver IC 7 may receive, for example, image data or image information including an image control signal corresponding to a command for controlling the image data from other components of the display apparatus 1 through the interface module 7a. For example, the image information may be received from the processor 5 (for example, a main processor (such as an application processor) or an auxiliary processor (such as a graphic processing unit) that operates independently of a function of the main processor).

The display driver IC 7 may store at least a part of the received image information in the memory 7b, for example, in units of frames. The image processing module 7c may perform pre-processing or post-processing (for example, resolution, brightness, or size adjustment) on at least a part of the image data based on a characteristic of the image data or a characteristic of the substrate 40. The mapping module 7d may generate a voltage value or a current value corresponding to the image data pre-processed or post-processed by the image processing module 7c. According to one example, the generation of the voltage value or the current value may be performed at least partially based on, for example, attributes of pixels arranged on the substrate 40 (for example, arrangement of the pixels (an RGB stripe structure or RGB gentile structure) or a size of each sub-pixel). At least some pixels of the substrate 40 are driven at least partially based on the voltage value or current value, and thus, visual information (for example, a text, an image, or an icon) corresponding to the image data may be displayed through the substrate 40.

The display driver IC 7 may transmit a drive signal (for example, a driver drive signal or a gate drive signal) to the display based on the image information received from the processor 5.

The display driver IC 7 may display an image based on an image signal received from the processor 5. For example, the display driver IC 7 may generate a drive signal for a plurality of sub-pixels based on an image signal received from the processor 5, and display an image by controlling light emission of the plurality of sub-pixels based on the drive signal.

The display module 3 may further include a touch circuit (not illustrated). The touch circuit may include a touch sensor and a touch sensor IC for controlling the touch sensor. The touch sensor IC may control the touch sensor to detect, for example, a touch input or a hovering input to a designated position in the substrate 40. For example, the touch sensor IC may detect a touch input or a hovering input by measuring a change in signal (for example, a voltage, a light quantity, a resistance, or a charge amount) for a designated position in the substrate 40. The touch sensor IC may provide information (for example, a position, an area, a pressure, or a time) regarding the detected touch input or hovering input to the processor 5. According to one example, at least a part (for example, the touch sensor IC) of the touch circuit may be included as the display driver IC 7, a part of the substrate 40, or another component (for example, the auxiliary processor) disposed outside the display module 3.

The processor 5 may be implemented by a digital signal processor (DSP) that processes a digital image signal, a microprocessor, a graphics processing unit (GPU), an artificial intelligence (AI) processor, a neural processing unit (NPU), or a time controller (TCON). However, the processor 5 is not limited thereto, and may include one or more of a central processing unit (CPU), a micro controller unit (MCU), a micro processing unit (MPU), a controller, an application processor (AP), a communication processor (CP), and an ARM processor, or may be defined by these terms. In addition, the processor 5 may be implemented by a system-on-chip (SoC) or a large scale integration (LSI) in which a processing algorithm is embedded or may be implemented in the form of an application specific integrated circuit (ASIC) or a field programmable gate array (FPGA).

The processor 5 may drive an operating system or an application program to control hardware or software components connected to the processor 5, and may perform various types of data processing and computation. In addition, the processor 5 may load and process a command or data received from at least one of other components into a volatile memory, and store various data in a non-volatile memory.

The display module 3 may be a touch screen coupled with a touch sensor, a flexible display, a rollable display, and/or a three dimension display.

Figure 2:
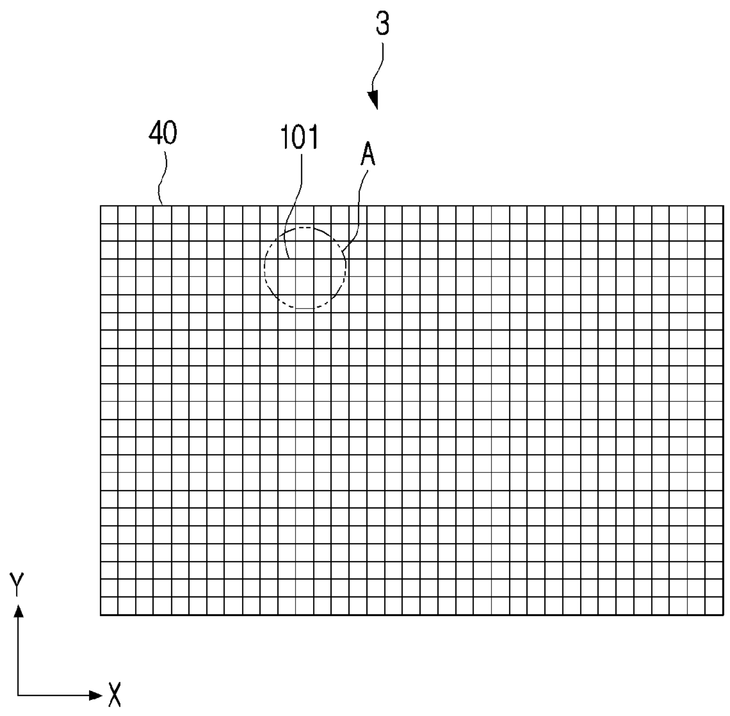
FIG. 2 is a plan view illustrating a display module according to one example of the disclosure.
Figure 3:
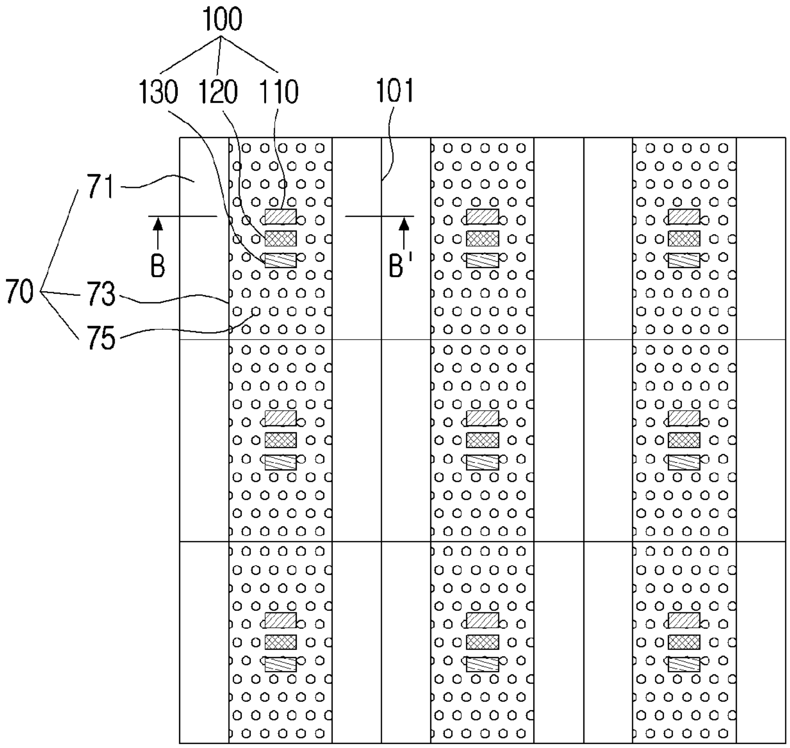
FIG. 3 is an enlarged view of a portion A illustrated in FIG. 2.
Figure 4:
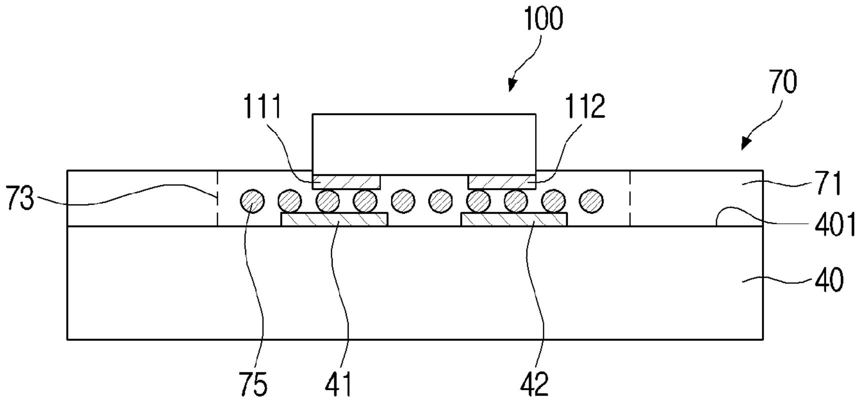
FIG. 4 is a cross-sectional view taken along line B-B' of FIG. 3.

FIG. 2 is a plan view illustrating the display module according to one example of the disclosure. FIG. 3 is an enlarged view of a portion (for example, a portion A illustrated in FIG. 2) of the display module according to one example of the disclosure. FIG. 4 is a view illustrating a cross section (for example, a cross section taken along line B-B' of FIG. 3) of a portion of the display module according to one example of the disclosure.

Referring to FIGS. 2 and 3, the display module 3 may include the substrate 40 and a plurality of pixels 100 provided on a first surface of the substrate 40. For example, the plurality of pixels 100 may be respectively arranged in pixel regions 101 arranged in a matrix form on the substrate 40.

A thin film transistor (TFT) circuit electrically connected to the plurality of pixels 100 may be provided on the first surface of the substrate 40. The TFT provided on the substrate 40 may be an amorphous silicon (a-Si) TFT, a low-temperature polycrystalline silicon (LTPS) TFT, a low-temperature polycrystalline oxide (LTPO) TFT, a hybrid oxide and polycrystalline silicon (HOP) TFT, a liquid crystalline polymer (LCP) TFT, or an organic TFT (OTFT).

Referring to FIG. 3, each of the plurality of pixels 100 may include at least three sub-pixels. The sub-pixel may be, for example, a micro LED that is an inorganic light emitting diode. Hereinafter, for convenience, the sub-pixel is referred to as a micro LED. Here, the micro LED may be defined as an LED having a size of 100 μm or less or 30 μm or less.

Each pixel 100 may include a first micro LED 110 that emits light in a red wavelength band, a second micro LED 120 that emits light in a green wavelength band, and a third micro LED 130 that emits light in a blue wavelength band.

In each pixel 100, the first micro LED 110, the second micro LED 120, and the third micro LED 130 may be disposed in the pixel region 101 partitioned in the substrate 40. A plurality of TFTs for driving the first to third micro LEDs 110, 120, and 130 may be disposed in a region not occupied by the first to third micro LEDs 110, 120, and 130 in the pixel region.

The first to third micro LEDs 110, 120, and 130 may be arranged in a line at regular intervals, but are not limited thereto. For example, the first to third micro LEDs 110, 120, and 130 may be arranged in an L-letter shape or in a pentile RGBG layout. The pentile RGBG layout is a layout in which the sub-pixels are arranged in such a way that the numbers of red, green, and blue sub-pixels are at a ratio of 1:1:2 (RGBG) based on a cognitive characteristic that a person identifies green better than blue. The pentile RGBG layout may enable an increase in yield and a reduction in unit cost. The pentile RGBG layout may enable implementation of a high resolution on a small screen.

One pixel 100 is described as including three micro LEDs 110, 120, and 130, but is not limited thereto. For example, one pixel 100 may include one micro LED or four or more micro LEDs (for example, red, green, blue, and white LEDs).

Referring to FIG. 4, a plurality of electrode pads 41 and 42 may be arranged in a pair at an interval on one surface 401 of the substrate 40. The plurality of electrode pads 41 and 42 may be electrically connected to a first electrode 111 and a second electrode 112 of the first micro LED 110, respectively.

A bonding member 70 may be stacked on one surface 401 of the substrate 40. The bonding member 70 may include an adhesive layer 71 and a plurality of fine conductive balls 75 included in the adhesive layer 71. The adhesive layer 71 may be formed of a thermosetting material (for example, an epoxy resin, a polyurethane resin, or an acrylic resin). Alternatively, the adhesive layer 71 of the bonding member 70 may be a non-conductive film (NCF) or a non-conductive paste (NCP). The plurality of conductive balls 75 may have a fine size (for example, about 3 to 15 μm) and contain polymer particles and conductive films (for example, gold (Au), nickel (Ni), or lead (Pd)) coating an outer circumferential surface of the polymer particle at a predetermined thickness.

Referring to FIG. 3, the plurality of conductive balls 75 may be arranged in a predetermined pattern within the adhesive layer 71. The pattern may correspond to a conductive region 73 in which the plurality of conductive balls 75 correspond to the plurality of electrode pads 41 and 42. In this case, the pattern of the conductive region 73 may be a stripe pattern in which the plurality of electrode pads 41 and 42 disposed in the pixel regions 101 adjacent to each other are connected in a straight line. In some embodiments, each conductive region of conductive regions disposed in respective pixel regions includes a plurality of sub-conductive regions corresponding to the plurality of sub-pixels. The pattern connecting the respective pixel regions 101 in a straight line may be formed in a vertical direction along an arrangement direction of the first to third micro LEDs 110, 120, and 130.

As the plurality of conductive balls 75 are patterned in such a way as to be limitedly positioned in a part of the entire region of the adhesive layer 71, the manufacturing cost of the bonding member 70 may be reduced by reducing the number of conductive balls that are not involved in connection between electrodes of the first to third micro LEDs 110, 120, and 130 and the electrode pads 41 and 42 of the substrate 40. In this case, among the plurality of conductive balls 75 disposed in the conductive region 73, some of the conductive balls spaced apart from the electrode pads 41 and 42 of the substrate 40 do not have to be directly involved in connection between the electrodes of the first to third micro LEDs 110, 120, and 130 and the electrode pads 41 and 42 of the substrate 40. Thus, in some embodiments, an aligning of the plurality of conductive balls 75 in the plurality of grooves 210 is performed to reduce a number of the plurality of conductive balls 75 that are not involved in connection between electrodes of the micro LED chips (pixels 100, see FIG. 4) to electrode pads 41 of the substrate 40 of the display module 3.

An interval between the plurality of conductive balls 75 may be an interval at which at least two or three conductive balls 75 may be disposed between the electrodes of the first to third micro LEDs 110, 120, and 130 and the corresponding electrode pads of the substrate 40. Accordingly, the connection between the electrodes of the first to third micro LEDs 110, 120, and 130 and the corresponding electrode pads of the substrate 40 may be stably made.

The first to third micro LEDs 110, 120, and 130 may be transferred to the substrate 40 in a state in which the bonding member 70 having the conductive region 73 formed in a certain pattern is stacked on one surface 401 of the substrate 40. For example, the first micro LED 110 may be transferred from a growth substrate to the substrate 40, or may be transferred from the growth substrate to an interposer (or a relay substrate) and then transferred from the interposer (or the relay substrate) to the substrate 40. The second and third micro LEDs 120 and 130 may also be transferred to the substrate 40 in the same manner as the first micro LED.

A method for transferring the first to third micro LEDs 110, 120, and 130 may be a laser transfer method, a self-assembly method, a roll transfer method, an electrostatic microelectromechanical system (MEMS) method, a vacuum membrane method, or an elastomeric stamp method.

The first to third micro LEDs 110, 120, and 130 transferred to the substrate 40 may be mounted on the substrate 40 through a thermal compression process. For example, the first and second electrodes 111 and 112 of the first micro LED 110 may be electrically and physically connected to the pair of electrode pads 41 and 42 of the substrate 40 by the plurality of conductive balls 75. In this case, the plurality of conductive balls 75 may be eutectic-bonded to each of the first and second electrodes 111 and 112 of the first micro LED 110 and the pair of electrode pads 41 and 42 by high-temperature heat provided during the thermal compression process. Similarly to the first micro LED 110, the first and second electrodes of the second and third micro LEDs 120 and 130 may be electrically and physically connected to the corresponding electrode pads, respectively, by the plurality of conductive balls 75.

FIGS. 5 to 9 are views illustrating patterns of the bonding member according to one example of the disclosure.

Figure 5:
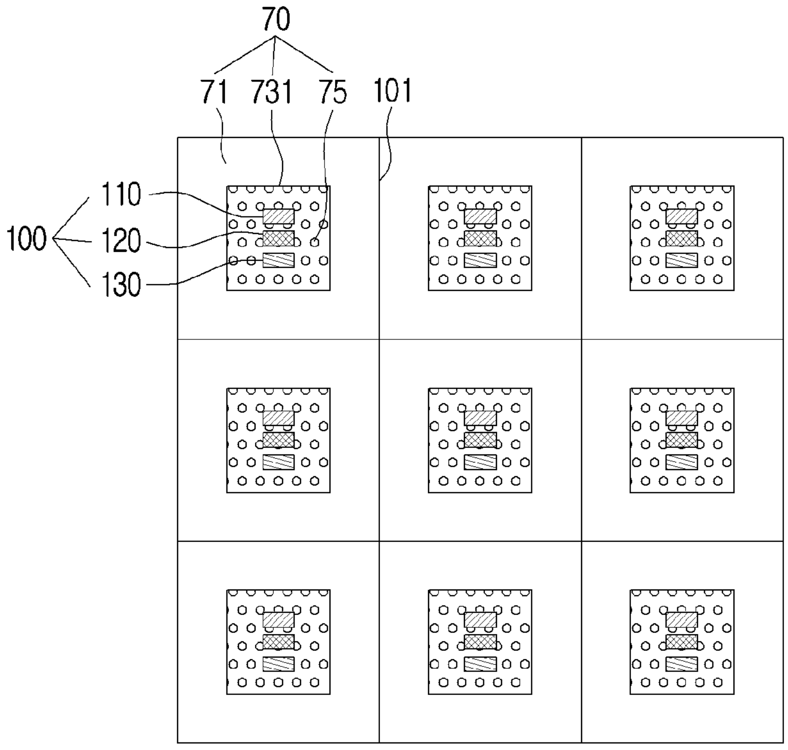
FIG. 5 is a view illustrating a pattern of a bonding member according to one example of the disclosure.

Referring to FIG. 5, the pattern of the plurality of conductive balls 75 may be an island pattern in which conductive regions 731 are independently disposed in the plurality of pixel regions 101, respectively. In this case, each conductive region 731 may be spaced apart from the conductive regions disposed in adjacent pixel regions 101 at regular intervals. The conductive region 731 may include a region surrounding the first to third micro LEDs 110, 120, and 130 and may be positioned at the center of the pixel region 101. The conductive region 731 may have a substantially quadrangular shape (for example, a rectangular shape or a square shape), but is not limited thereto, and may be formed in a polygonal shape such as a triangular shape or a pentagonal shape.

Figure 6:
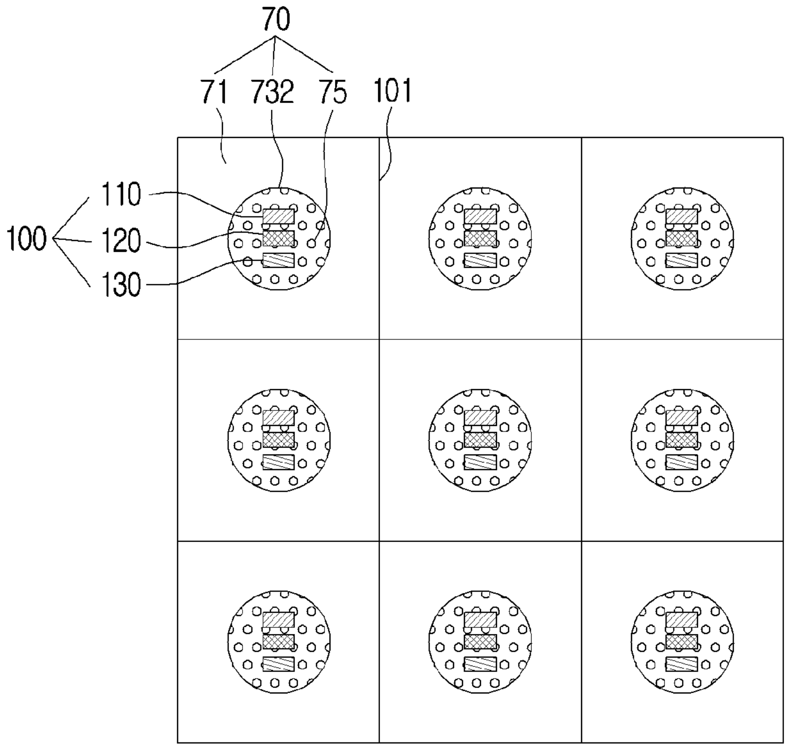
FIG. 6 is a view illustrating a pattern of the bonding member according to one example of the disclosure.

Referring to FIG. 6, the pattern of the plurality of conductive balls 75 may be an island pattern in which conductive regions 732 are independently disposed in the plurality of pixel regions 101, respectively. In this case, the conductive region 732 may be approximately circular or elliptical.

Figure 7:
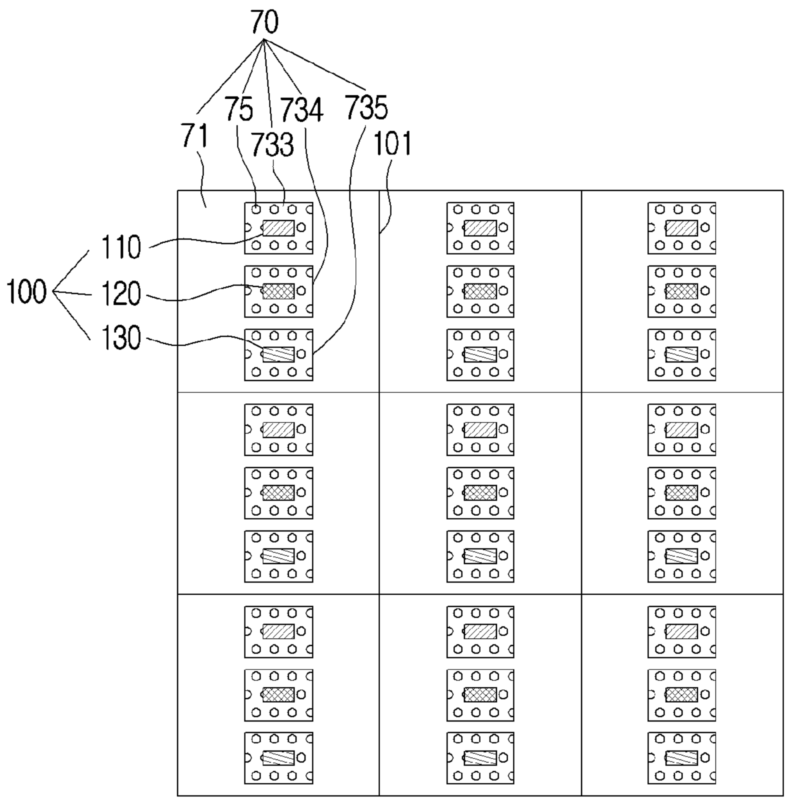
FIG. 7 is a view illustrating a pattern of the bonding member according to one example of the disclosure.

Referring to FIG. 7, the pattern of the plurality of conductive balls 75 may be an island pattern in which the conductive regions are independently disposed, and a plurality of patterns may be disposed in one pixel region 101. For example, the conductive regions may include a first conductive region 733 corresponding to a pair of electrode pads to which the first micro LED 110 is connected, a second conductive region 734 corresponding to a pair of electrode pads to which the second micro LED 120 is connected, and a third conductive region 735 corresponding to a pair of electrode pads to which the third micro LED 130 is connected. The first conductive region 733 and the second conductive region 734 may be spaced apart from each other, and the second conductive region 734 and the third conductive region 735 may be spaced apart from each other. The first to third conductive regions 733, 734, and 735 may be formed in a quadrangular shape, but are not limited thereto, and may be formed in a polygonal shape (a triangular shape, a pentagonal shape, or the like), a circular shape, or an elliptical shape.

Figure 8:
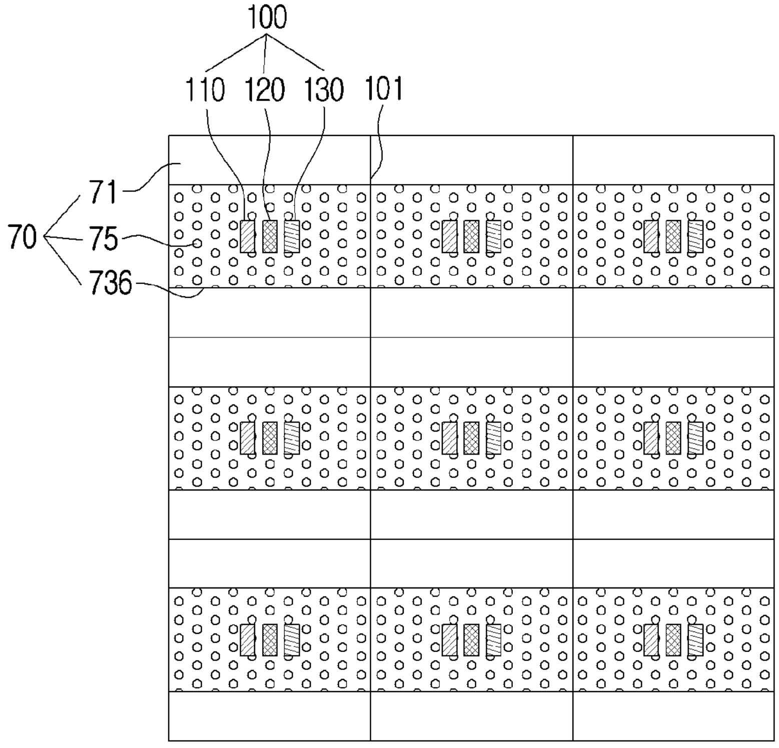
FIG. 8 is a view illustrating a pattern of the bonding member according to one example of the disclosure.

Referring to FIG. 8, the pattern of the plurality of conductive balls 75 may be a stripe pattern in which conductive regions 736 connect adjacent pixel regions 101 in a straight line. In this case, the pattern may be formed in a horizontal direction along the arrangement direction of the first to third micro LEDs 110, 120, and 130.

Figure 9:
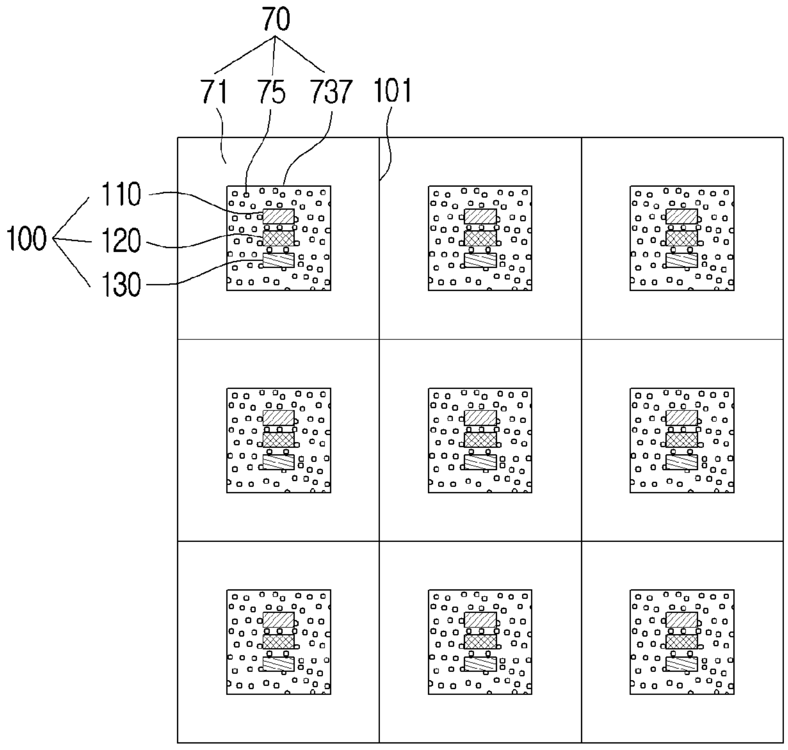
FIG. 9 is a view illustrating a pattern of the bonding member according to one example of the disclosure.

Referring to FIG. 9, the plurality of conductive balls 75 disposed in a conductive region 737 may be arranged in a non-aligned state in which an interval between adjacent conductive balls is not uniform. The conductive region 737 may be formed in a quadrangular shape, but are not limited thereto, and may be formed in a polygonal shape (a triangular shape, a pentagonal shape, or the like), a circular shape, or an elliptical shape.

Figure 10:
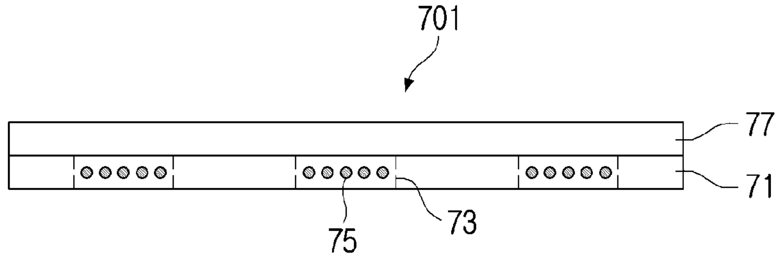
FIG. 10 is a view illustrating a bonding member according to one example of the disclosure.
Figure 11:
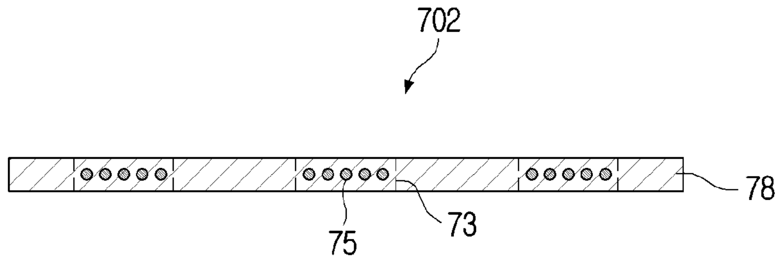
FIG. 11 is a view illustrating a bonding member according to one example of the disclosure.
Figure 12:
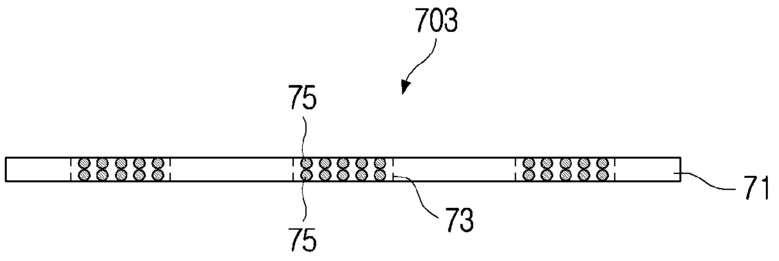
FIG. 12 is a view illustrating a bonding member according to one example of the disclosure.

FIGS. 10 to 12 are views illustrating bonding members according to one example of the disclosure.

Referring to FIG. 10, a bonding member 701 according to one example of the disclosure may have a multilayer structure. For example, the bonding member 701 may include a first adhesive layer 71, a plurality of conductive balls 75 included in the first adhesive layer 71, and a second adhesive layer 77 stacked on the first adhesive layer 71. A pattern of the plurality of conductive balls 75 may be a pattern in which a conductive region 73 corresponds to one of the conductive regions illustrated in FIGS. 3, 5, and 6 to 9. The second adhesive layer 77 may be a non-conductive film (NCF) or a non-conductive paste (NCP).

Referring to FIG. 11, a bonding member 702 according to one example of the disclosure may include an adhesive layer 78 having a black-based color and a plurality of conductive balls 75 included in the adhesive layer 78. A pattern of the plurality of conductive balls 75 may be a pattern in which a conductive region 73 corresponds to one of the conductive regions illustrated in FIGS. 3, 5, and 6 to 9.

Referring to FIG. 12, a bonding member 703 according to one example of the disclosure may include an adhesive layer 71 and a plurality of conductive balls 75 included in the adhesive layer 71. A pattern of the plurality of conductive balls 75 may be a pattern in which a conductive region 73 corresponds to one of the conductive regions illustrated in FIGS. 3, 5, and 6 to 9. The plurality of conductive balls 75 may be arranged in at least two layers in a thickness direction of the adhesive layer 71.

Accordingly, even in case that a pressure applied to the plurality of micro LEDs is insufficient due to variations or errors in thermal process conditions for connecting the plurality of micro LEDs to the substrate, connection between the electrodes of the micro LEDs and the electrode pads of the substrate may be favorably made by the plurality of conductive balls 75 vertically arranged in the thickness direction of the adhesive layer 71, and therefore, it is possible to improve the yield of the display module 3. In addition, even in case that the micro LEDs are tilted due to variations in pressure applied to the micro LEDs, connection between the electrodes of the micro LEDs and the electrode pads of the substrate may favorably made by the plurality of conductive balls 75.

Hereinafter, a manufacturing method for the bonding member 703 in which the plurality of conductive balls 75 are arranged in at least two layers in the thickness direction of the adhesive layer 71 will be described.

Figure 13:
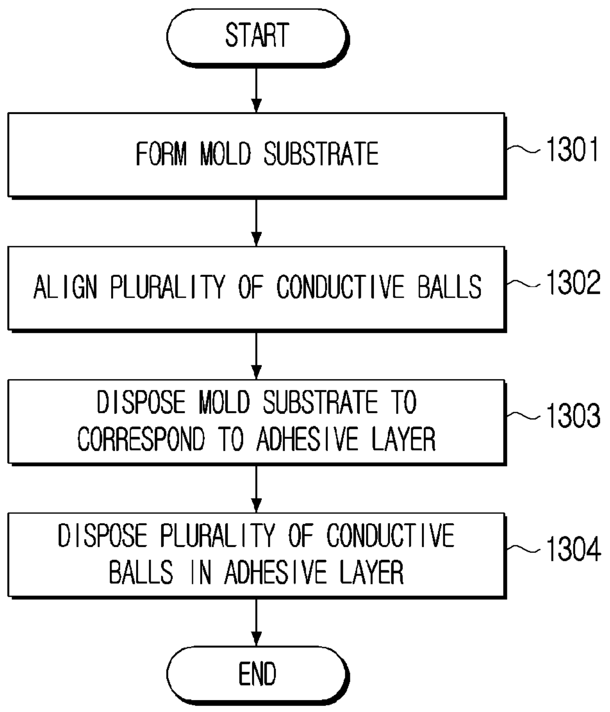
FIG. 13 is a flowchart illustrating a manufacturing method for the bonding member according to one example of the disclosure.
Figure 14:
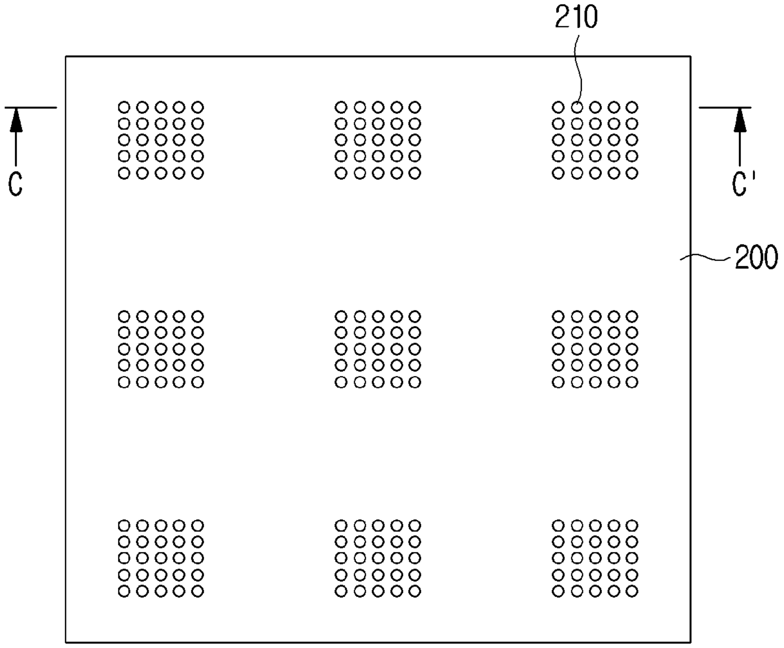
FIG. 14 is a plan view illustrating a mold substrate for manufacturing the bonding member according to one example of the disclosure.
Figure 15:
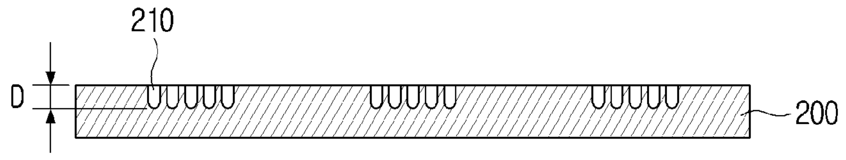
FIG. 15 is a cross-sectional view taken along line C-C' of FIG. 14.
Figure 16:
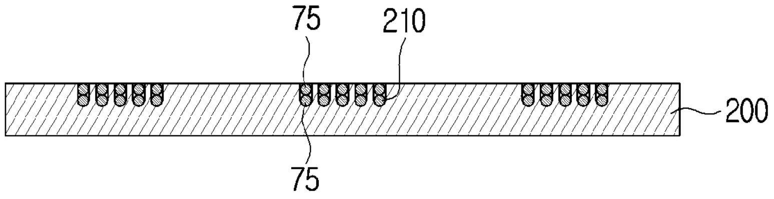
FIG. 16 is a view illustrating a bonding member manufacturing process according to one example of the disclosure.
Figure 17:
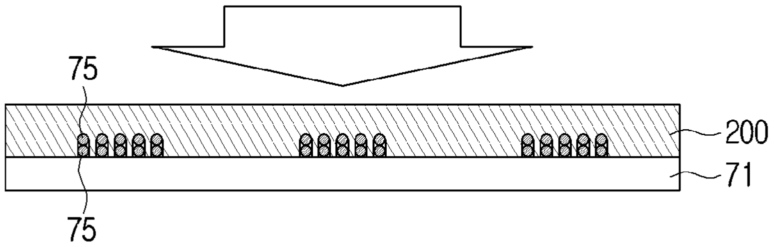
FIG. 17 is a view illustrating the bonding member manufacturing process according to one example of the disclosure.
Figure 18:
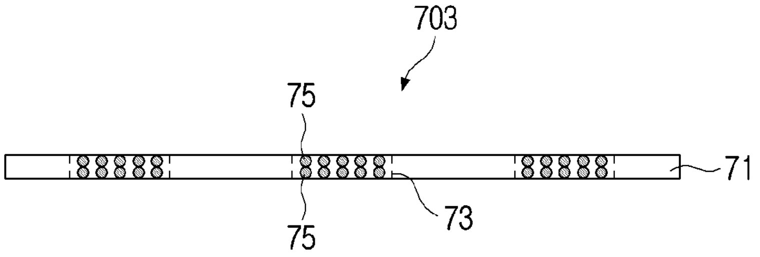
FIG. 18 is a view illustrating the bonding member manufacturing process according to one example of the disclosure.

FIG. 13 is a flowchart illustrating the manufacturing method for the bonding member according to one example of the disclosure. FIG. 14 is a plan view illustrating a mold substrate for manufacturing the bonding member according to one example of the disclosure. FIG. 15 is a cross-sectional view taken along line C-C' of FIG. 14. FIGS. 16 to 18 are views illustrating a bonding member manufacturing process according to one example of the disclosure.

A mold substrate 200 may be manufactured through the following process, but is not limited thereto. First, a photoresist is applied on a wafer (for example, a Si wafer or a glass wafer), and the wafer is heated. One surface of the wafer on which the photoresist is applied is coated with a fluoropolymer thin film to form a plurality of grooves 210 in the mold substrate 200. A thermosetting polymer is applied on the fluoropolymer thin film and then cured to form the mold substrate 200 illustrated in FIG. 14 (1301 in FIG. 13).

Referring to FIG. 14, in the mold substrate 200, the plurality of conductive balls 75 may be aligned in two layers before being disposed in the adhesive layer 71. The mold substrate 200 may have the plurality of grooves 210 into which the plurality of conductive balls 75 are inserted. A pattern of the plurality of grooves 210 may determine the pattern of the plurality of conductive balls 75 disposed in the bonding member 703 (see FIG. 12).

Referring to FIG. 15, the plurality of grooves 210 may have a predetermined depth D in such a way that the plurality of conductive balls 75 are arranged in two layers. In this case, the depth D of the groove 210 may be at least twice the diameter of the conductive ball 75. Accordingly, in each of the plurality of grooves 210, at least two conductive balls 75 may be inserted in the vertical direction and vertically stacked. A diameter (or width) of each of the plurality of grooves 210 may be equal to or larger than the diameter of the conductive ball 75.

The mold substrate 200 may be formed of a thermosetting polymer (for example, polydimethylsiloxane (PDMS)) that has elasticity and may easily form the plurality of fine grooves 210.

In the mold substrate 200, an optical transparent resin (for example, an optically clear adhesive (OCA), an optically clear resin (OCR), an ethylene vinyl acetate copolymer (EVA), or a polyolefin (POE)) or an adhesive may be applied on the plurality of grooves 210 to enable easy insertion of the plurality of conductive balls 75 into the plurality of grooves 210.

Referring to FIG. 16, the plurality of conductive balls 75 are scattered on the mold substrate 200 and then inserted into the plurality of grooves 210 of the mold substrate 200. Accordingly, the plurality of conductive balls 75 may be aligned in the plurality of grooves 210 (1302 in FIG. 13). In this case, surface treatment may be performed to prevent the plurality of conductive balls 75 from being attached to the surface of the mold substrate 200 other than the plurality of grooves 210. The surface treatment may be performed in the process of manufacturing the mold substrate 200. For example, the surface of the mold substrate 200 without the plurality of grooves 210 may be plasma treated to form fine irregularities or may be subjected to hydrophobic treatment. In some embodiments, the mold substrate 200 is a relay substrate, the plurality of grooves 210 are in the relay substrate, and the plurality of grooves 210 are treated with a plasma to prevent the plurality of conductive balls 75 from sticking to the relay substrate.

Referring to FIG. 17, the mold substrate 200 in which the plurality of conductive balls 75 are inserted into the plurality of grooves 210 is seated on the adhesive layer 71. The plurality of grooves 210 may be disposed to face the adhesive layer 71 (1303 in FIG. 13).

In this state, the mold substrate 200 is pressed toward the adhesive layer 71 with a predetermined pressure. Accordingly, as the mold substrate 200 is compressed by its own elasticity, the plurality of conductive balls 75 inserted into the plurality of grooves 210 may be introduced into the adhesive layer 71 (1304 in FIG. 13).

The adhesive layer 71 may be heated to a predetermined temperature to make the plurality of conductive balls 75 be smoothly introduced into the adhesive layer 71 based on the mold substrate 200 being pressed.

The adhesive layer 71 may be a non-conductive film (NCF). The adhesive layer 71 may contain flux to enable favorable bonding between the conductive ball 75 and the electrode of the micro LED.

Referring to FIG. 18, the bonding member 703 in which the plurality of conductive balls 75 are arranged in two layers in the adhesive layer 71 may be manufactured through the above process. In this case, the pattern of the plurality of conductive balls 75 may be a pattern in which the conductive region 73 corresponds to one of the conductive regions illustrated in FIGS. 3, 5, and 6 to 9.

Figure 19:
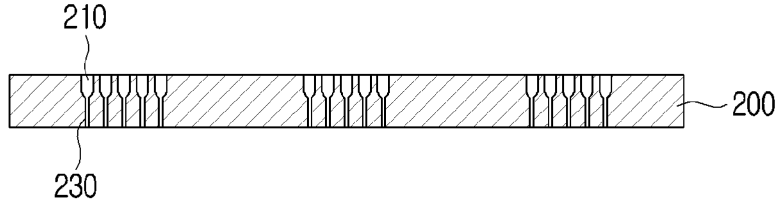
FIG. 19 is a cross-sectional view illustrating the mold substrate for manufacturing the bonding member according to one example of the disclosure.
Figure 20:
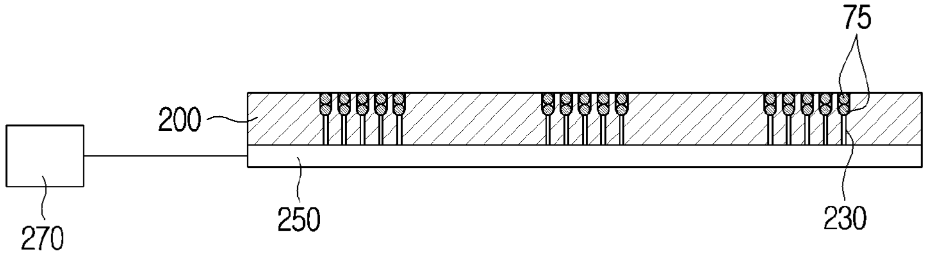
FIG. 20 is a view illustrating an example in which a plurality of conductive balls are aligned in a plurality of grooves of the mold substrate by using vacuum suction.

FIG. 19 is a cross-sectional view illustrating the mold substrate for manufacturing the bonding member according to one example of the disclosure. FIG. 20 is a view illustrating an example in which the plurality of conductive balls are aligned in the plurality of grooves of the mold substrate by using vacuum suction.

Referring to FIG. 19, a plurality of holes 230 communicating with the plurality of grooves 210 may be formed in the other surface of the mold substrate 200. The plurality of holes 230 may have a diameter smaller than that of the plurality of grooves 210. Regarding the dimensioning of the plurality of grooves 210, the plurality of conductive balls 75 in the plurality of grooves 210 are configured to support electrical connection of pads 112 of inorganic light emitting diodes disposed at an ultra-fine pitch on the substrate 40 of the display module 3. The display module 3 comprises the display driver IC 7 for controlling the substrate 40, and the manufacturing process, in some embodiments, includes mounting the (pixels 100) inorganic light emitting diodes on the substrate 40 to be controlled in use by the display driver IC 7. In some embodiments, the inorganic light emitting diodes (pixels 100) are in a form of micro LED chips, the substrate 40 of the display module 3 is an anisotropic conductive film (ACF). The method in some embodiments includes mounting the micro LED chips to the substrate using the ACF and a thermo-compression bonding process.

Referring to FIG. 20, the plurality of conductive balls 75 may be aligned in the plurality of grooves 210 by a vacuum suction method using the mold substrate 200. For example, vacuum pressure may be formed in the plurality of holes 230 by driving a vacuum source 270 in a state in which a suction pad 250 is in close contact with the other surface of the mold substrate 200. In this case, vacuum pressure may also be formed in the plurality of grooves 210 respectively connected to the plurality of holes 230. The vacuum source 270 may be a vacuum motor or a vacuum pump.

The plurality of conductive balls 75 scattered on the mold substrate 200 may be sucked into the plurality of grooves 210 by the vacuum pressure formed in the plurality of grooves 210. Accordingly, the plurality of conductive balls 75 may be aligned in the plurality of grooves 210 by the vacuum suction method.

The suction pad 250 may have a first passage formed therein and connected to the vacuum source 270, and a plurality of second passages respectively connected to the plurality of holes 230 of the mold substrate 200. As the plurality of second passages are connected to the first passage, vacuum pressure may also be formed in the plurality of holes 230 based on vacuum pressure being formed in the first passage.

The vacuum source 270 may be continuously driven until stacking of the mold substrate 200 on the adhesive layer 71 is completed. Therefore, it is possible to prevent the plurality of conductive balls 75 from escaping from the plurality of grooves 210 of the mold substrate 200 during stacking of the mold substrate 200 on the adhesive layer 71. Accordingly, the suction pad 250 may be separated from the mold substrate 200 after stacking of the mold substrate 200 on the adhesive layer 71 is completed, and then, the mold substrate 200 may be pressed against the adhesive layer 71.

Hereinabove, the disclosure has been described as an illustrative method. It is to be understood that terms used herein are provided in order to describe the disclosure rather than limiting the disclosure. Various modifications and alternations of the disclosure may be made according to the contents described above. Therefore, the disclosure may be freely practiced without departing from the scope of the claims unless additionally mentioned.

What is claimed is:

1. A display module comprising:

a substrate partitioned into a plurality of pixel regions and including a plurality of electrode pads disposed in the plurality of pixel regions;

a bonding member including an adhesive layer stacked on one surface of the substrate and a plurality of conductive balls disposed in the adhesive layer; and a plurality of light emitting diodes including electrodes connected to the plurality of electrode pads by the plurality of conductive balls, wherein the plurality of conductive balls are patterned as conductive regions corresponding to the plurality of electrode pads, wherein the conductive regions are horizontally spaced apart from each other, wherein the plurality of light emitting diodes are horizontally spaced apart from each other, and wherein at least two of the plurality of light emitting diodes overlap with a same one of the conductive regions, and the at least two of the plurality of light emitting diodes are electrically connected to at least two electrode pads, from among the plurality of electrode pads, that are in the same one of the conductive regions.

2. The display module as claimed in claim 1, wherein a pattern of the plurality of conductive balls is a stripe pattern, the conductive regions are disposed in the plurality of pixel regions adjacent to each other, and the conductive regions are configured to connect, in a straight line, the plurality of electrode pads.

3. The display module as claimed in claim 1, wherein a pattern of the plurality of conductive balls are disposed in an island pattern in which the conductive regions are independently disposed in the plurality of pixel regions, respectively.

4. The display module as claimed in claim 3, wherein a pixel provided in the plurality of pixel regions includes a plurality of sub-pixels, each conductive region of the conductive regions disposed in respective pixel regions of the plurality of pixel regions includes a plurality of sub-conductive regions corresponding to the plurality of sub-pixels, and the plurality of sub-conductive regions are spaced apart from each other.

5. The display module as claimed in claim 1, wherein the plurality of conductive balls are arranged in at least two layers in a thickness direction of the adhesive layer.

6. A bonding member connecting between electrodes of a light emitting diode and electrode pads of a display substrate, the bonding member comprising:

an adhesive layer;

a plurality of conductive balls disposed in the adhesive layer; and an additional adhesive layer stacked on the adhesive layer, wherein the plurality of conductive balls are patterned as conductive regions in a part of an entire region of the bonding member.

7. The bonding member as claimed in claim 6, wherein a pattern of the plurality of conductive balls are disposed in a stripe pattern in which the conductive regions form a plurality of straight lines.

8. The bonding member as claimed in claim 6, wherein a pattern of the plurality of conductive balls is an island pattern in which the conductive regions are spaced apart from each other.

9. The bonding member as claimed in claim 6, wherein the adhesive layer has a black-based color.

10. A display module comprising:

a substrate partitioned into a plurality of pixel regions and including a plurality of electrode pads disposed in the plurality of pixel regions;

a bonding member including an adhesive layer stacked on one surface of the substrate and a plurality of conductive balls disposed in the adhesive layer; and a plurality of light emitting diodes including electrodes connected to the plurality of electrode pads by the plurality of conductive balls, wherein the plurality of conductive balls are patterned as conductive regions corresponding to the plurality of electrode pads, wherein a pixel provided in the plurality of pixel regions includes a plurality of sub-pixels, wherein each conductive region of the conductive regions disposed in respective pixel regions of the plurality of pixel regions includes a plurality of sub-conductive regions corresponding to the plurality of sub-pixels, and wherein the plurality of sub-conductive regions are spaced apart from each other.

* * * * *